United States Patent
Lv et al.

(10) Patent No.: US 10,362,692 B2
(45) Date of Patent: Jul. 23, 2019

(54) ENCAPSULATED ELECTRICAL DEVICE AND METHOD OF FABRICATION

(71) Applicant: HAMLIN ELECTRONICS (SUZHOU) CO. LTD., Jiangsu (CN)

(72) Inventors: Haitao Lv, Jiangsu (CN); Guiting Chu, Jiangsu (CN); Shangchun Pan, Jiangsu (CN)

(73) Assignee: HAMLIN ELECTRONICS (SUZHOU) CO. LTD., Jiangsu (CN)

(*) Notice: Subject to any disclaimer, the term of this patent is extended or adjusted under 35 U.S.C. 154(b) by 0 days.

(21) Appl. No.: 15/565,234

(22) PCT Filed: Apr. 10, 2015

(86) PCT No.: PCT/CN2015/076260
§ 371 (c)(1),
(2) Date: Oct. 9, 2017

(87) PCT Pub. No.: WO2016/161617
PCT Pub. Date: Oct. 13, 2016

(65) Prior Publication Data
US 2018/0084657 A1 Mar. 22, 2018

(51) Int. Cl.
*H05K 5/00* (2006.01)
*G01D 11/24* (2006.01)
*H05K 3/28* (2006.01)

(52) U.S. Cl.
CPC ........... *H05K 5/0034* (2013.01); *G01D 11/24* (2013.01); *H05K 3/284* (2013.01)

(58) Field of Classification Search
CPC .............................. H05K 5/0034; G01D 11/24
See application file for complete search history.

(56) References Cited

U.S. PATENT DOCUMENTS 6,034,421 A * 3/2000 Tokunaga ............. G01L 19/141
257/666
6,307,749 B1 * 10/2001 Daanen .................. H05K 3/284
174/50.5
(Continued)

FOREIGN PATENT DOCUMENTS

CN 1508516 A 6/2004
CN 101231933 A 7/2008
(Continued)

OTHER PUBLICATIONS

Extended European Search Report for European Patent Application No. 15888174, dated Oct. 25, 2018, 3 pages.

*Primary Examiner* — Hoa C Nguyen
*Assistant Examiner* — Keith DePew

(57) ABSTRACT

In one embodiment a device may include an electrical assembly having at least one electrical component; an inner shell comprising a first polymeric material conformally disposed around the electrical component, the inner shell comprising a first mechanical strength; and an outer shell comprising a second polymeric material conformally disposed around the inner shell, the outer shell comprising a second mechanical strength greater than the first mechanical strength, wherein the electrical component comprises a first coefficient of thermal expansion (CTE), the inner shell comprises a second CTE, and the outer shell comprises a third CTE, and wherein a difference between the first CTE and second CTE is less than a difference between the first CTE and third CTE.

17 Claims, 8 Drawing Sheets

FIG. 1

(56) References Cited

U.S. PATENT DOCUMENTS

| | | |
|---|---|---|
| 7,279,910 B2 | 10/2007 | Bond |
| 2004/0118227 A1* | 6/2004 | Tokunaga ............... B29C 70/72 73/866.1 |
| 2006/0077643 A1* | 4/2006 | Mayuzumi ............. H05K 3/284 361/753 |
| 2006/0125497 A1 | 6/2006 | Bond |
| 2006/0272150 A1* | 12/2006 | Eguchi ................... H05K 3/284 29/841 |
| 2007/0139044 A1* | 6/2007 | Lamb ................... G01D 11/245 324/252 |
| 2008/0036075 A1 | 2/2008 | Taylor |
| 2008/0084005 A1* | 4/2008 | Steele ..................... B60R 21/01 264/272.14 |
| 2009/0004557 A1 | 1/2009 | Lasarov et al. |
| 2009/0086446 A1* | 4/2009 | Sugimoto ............. H05K 3/284 361/752 |
| 2009/0106974 A1* | 4/2009 | Brandenburg .... B29C 45/14377 29/841 |
| 2010/0332074 A1* | 12/2010 | Brisighella, Jr. ........ H05K 5/06 701/31.4 |
| 2011/0229702 A1 | 9/2011 | Aizpuru et al. |
| 2012/0103089 A1* | 5/2012 | Cantolino ............. G01F 23/242 73/299 |
| 2014/0313675 A1* | 10/2014 | Choo ................. H05K 13/0023 361/709 |
| 2015/0092360 A1 | 4/2015 | Stillman et al. |
| 2015/0330446 A1* | 11/2015 | Kia ........................ F16C 33/30 428/172 |
| 2016/0269067 A1* | 9/2016 | Pidwerbecki ......... G06F 1/1626 |
| 2017/0184427 A1* | 6/2017 | Yano .................... G01D 11/245 |

FOREIGN PATENT DOCUMENTS

| | | |
|---|---|---|
| CN | 101307773 A | 11/2008 |
| CN | 201149495 Y | 11/2008 |
| CN | 103529311 A | 1/2014 |
| CN | 203375991 U | 1/2014 |
| DE | 102014212720 A1 | 1/2015 |
| JP | 4307760 A | 10/1992 |
| JP | 11330317 A | 11/1999 |
| JP | 2010071723 A | 4/2010 |

* cited by examiner

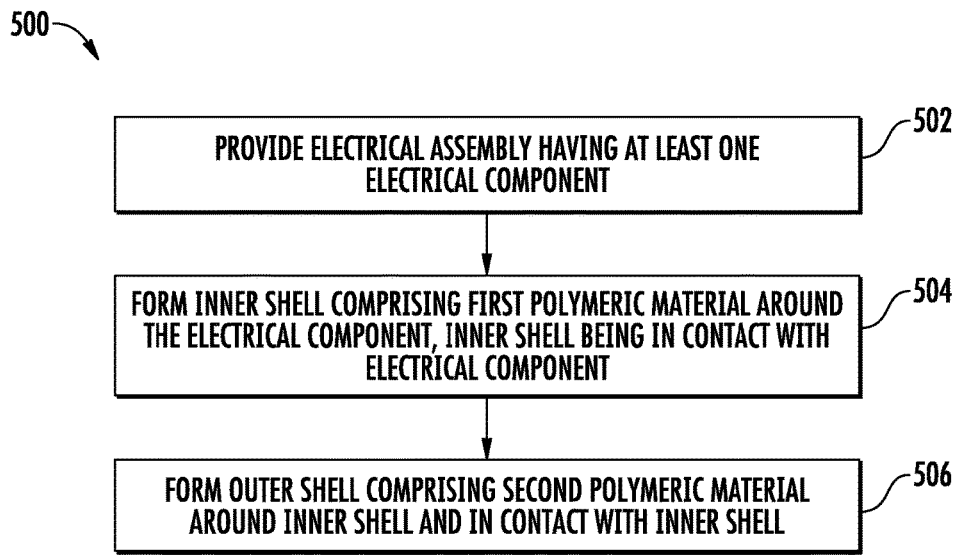

FIG. 5

| SPIRAL FLOW (at 175°C) | DQCB104QAF3 | cm | 62 |
| GEL TIME (at 175°C) | DQCB104QAF9 | sec | 27 |
| THERMAL EXPANSION $\alpha 1$ | DQCB104QAG4 | $\times 10^{-5}$/°C | 1.3 |
| THERMAL EXPANSION $\alpha 2$ | DQCB104QAG4 | $\times 10^{-5}$/°C | 5.5 |
| Tg | DQCB104QAG4 | °C | 172 |
| THERMAL CONDUCTIVITY | DQCB104QAG5 | $\times 10^{-4}$cal/sec·cm·°C | 21 |
| FLEXURAL STRENGTH (at 25°C) | DQCB104QAG0 | Kg/mm$^2$ | 15.6 |
| FLEXURAL MODULUS (at 25°C) | DQCB104QAG1 | Kg/mm2 | 1801 |
| SPECIFIC GRAVITY | DQCB104QAG2 | | 1.919 |
| VOLUME RESISTIVITY (at 150°C) | DQCB104QAH0 | $\times 10^{13}$ $\Omega$·cm | 2.3 |
| UL FLAME CLASS | DQCB104QAG7 | UL-94 | V-0 (3.2mm) |
| WATER ABSORPTION (Boiling 24Hr) | DQCB104QAG3 | wt% | 0.23 |
| EXTRACTED Na+ | DQCB104QAH3 | ppm | 1.2 |
| EXTRACTED Cl- | DQCB104QAH3 | ppm | 17 |

TYPICAL, NOT GUARANTEED PROPERTIES

MOLDING AND POST MOLD CURE CONDITIONS:

| | STANDARD | RANGE |
| TRANSFER PRESSURE | 50 Kgf/cm2 | 30~100 Kgf/cm2 |
| MOLD TEMPERATURE | 175°C | 160-195°C |
| CURE TIME | 60 sec | 40-90 sec |
| POST-MOLD CURE TEMP | 175°C | 170-180°C |
| POST-MOLD CURE TIME | 4 Hr | 4-8 Hr |

FIG. 6

| PROPERTY | TEST METHOD | UNITS | VALUE |
|---|---|---|---|
| | | | DAM |
| THERMAL | | | |
| CLTE, Normal | ISO 11359-1/-2 | $10^{-4}/K$ (E-4/F) | |
| -40 - 23°C (-40 - 73°F) | | | 0.65 (0.36) |
| 23 - 55°C (73 - 130°F) | | | 0.83 (0.46) |
| 55 - 160°C (130 - 320°F) | | | 1.37 (0.76) |
| CLTE, Parallel | ISO 11359-1/-2 | $10^{-4}/K$ (E-4/F) | |
| -40 - 23°C (-40 - 73°F) | | | 0.24 (0.13) |
| 23 - 55°C (73 - 130°F) | | | 0.18 (0.10) |
| 55 - 160°C (130 - 320°F) | | | 0.13 (0.07) |
| ELECTRICAL | | | |
| CTI | UL 746A | V | |
| 3.0mm | | | 408 |
| FLAMMABILITY | | | |
| Flammability Classification | UL94 | | |
| 0.71mm | | | HB |

| PROCESSING | | | |
|---|---|---|---|
| Melt Temperature Range | | °C (°F) | 285-305 (545-580) |
| Melt Temperature Optimum | | °C (°F) | 295 (565) |
| Mold Temperature Range | | °C (°F) | 70-120 (160-250) |
| Mold Temperature Optimum | | °C (°F) | 100 (210) |
| Drying Time, Dehumidifier Dryer | | h | 2-4 |
| Drying Temperature | | °C (°F) | 80 (175) |
| Processing Moisture Content | | % | <0.20 |

| PROPERTY | TEST METHOD | UNITS | VALUE | |
|---|---|---|---|---|
| | | | DAM | 50%RH |
| IDENTIFICATION | | | | |
|   Resin Identification | ISO 1043 | | PA66-GF33 | |
|   Part Marking Code | ISO 11469 | | >PA66-GF33< | |
| MECHANICAL | | | | |
|   Stress at Break | ISO 527 | MPa (kpsi) | 200 (29.0) | 140 (20.3) |
|   Strain at Break | ISO 527 | % | 3 | 4 |
|   Tensile Modulus | ISO 527 | MPa (kpsi) | 10500 (1520) | 8000 (1160) |
|   Flexural Modulus | ISO 178 | MPa (kpsi) | 9300 (1350) | |
|   Flexural Strength | ISO 178 | MPa (kpsi) | 280 (40.6) | 195 (28.3) |
|   Notched Charpy Impact Strength | ISO 179/IeA | $kJ/m^2$ | | |
|     -40°C (-40°F) | | | 10 | |
|     23°C (73°F) | | | 13 | 13 |
|   Unnotched Charpy Impact Strength | ISO 179/IeU | $kJ/m^2$ | 75 | 80 |
| THERMAL | | | | |
|   Deflection Temperature | ISO 75f | °C (°F) | | |
|     0.45MPa | | | 261 (502) | |
|     1.80MPa | | | 252 (486) | |
|   Melting Temperature | ISO 11357-1/-3 | °C (°F) | | |
|     10°C/min | | | 262 (504) | |

ENCAPSULATED ELECTRICAL DEVICE AND METHOD OF FABRICATION

BACKGROUND

Field

Embodiments relate to the field of circuit protection devices, and more particularly to a metal oxide varistor for surge protection.

Discussion of Related Art

Sensors and other electrical components are widely deployed in automotive, home, industrial, utility, office, and other environments. In many cases, sensors are designed for use over a range of conditions including variations in temperature, humidity, dirt, and other conditions. In automobiles, various sensors may be deployed in environments where the use temperature varies greatly, such as between −50° C. to 150° C. Sensors and other components may be provided on a printed circuit board (PCB) as a printed circuit board assembly (PCBA) in some examples. In order to protect a PCB component potting may be used to seal the PCB component, a process involving dispensing a liquid material configured to cure and solidify to form a coating around the PCB or components on the PCB. Disadvantageously, when sealed using potting, electrical components may be easily damaged in the harsh operating environment of an automobile. For example, a PCB may be deployed under the hood of an automobile where temperature may vary over a large range. The variation is temperature may lead to stresses, delamination, and other effects resulting because of different coefficients of thermal expansions between PCB components and potting material. Other approaches to sealing of PCBs include the application of low-pressure using hotmelt adhesives. Disadvantageously, the adhesive material may react with potting material and result in degradation of sealing material.

It is with respect to these and other issues the present improvements may be desirable.

SUMMARY

In one embodiment, a device may include an electrical assembly having at least one electrical component. The device may further include an inner shell comprising a first polymeric material disposed around the electrical assembly and in contact with the electrical assembly, the inner shell comprising a first mechanical strength; and an outer shell comprising a second polymeric material conformally disposed around the inner shell and in contact with the inner shell, the outer shell comprising a second mechanical strength greater than the first mechanical strength, wherein the electrical component comprises a first coefficient of thermal expansion (CTE), the inner shell comprises a second CTE, and the outer shell comprises a third CTE, and wherein a difference between the first CTE and second CTE is less than a difference between the first CTE and third CTE.

In another embodiment, a method of forming an electrical device may include providing an electrical assembly having at least one electrical component; forming an inner shell comprising a first polymeric material around the electrical assembly, the inner shell being in contact with the electrical assembly; and forming an outer shell comprising a second polymeric material around the inner shell and in contact with the inner shell, wherein the electrical assembly comprises a first coefficient of thermal expansion (CTE), the inner shell comprises a second CTE, and the outer shell comprises a third CTE, and wherein a difference between the second CTE and first CTE is less than a difference between the third CTE and first CTE.

In a further embodiment, a sensor device may include a printed circuit board; at least one sensor attached to the printed circuit board; an inner shell comprising a first polymeric material disposed around the printed circuit board and at least one electrical device, and in contact with the printed circuit board and at least one electrical device; and an outer shell comprising a second polymeric material disposed around the inner shell and in contact with the inner shell, wherein the electrical component comprises a first coefficient of thermal expansion (CTE), the inner shell comprises a second CTE, and the outer shell comprises a third CTE, and wherein a difference between the first CTE and second CTE is less than a difference between the first CTE and third CTE.

BRIEF DESCRIPTION OF THE DRAWINGS

FIG. 5 depicts an exemplary process flow in accordance with further embodiments;

FIG. 6 presents an exemplary list of properties for an inner shell used to form a device in accordance with embodiments of the disclosure;

FIG. 7A provides a list of properties for an outer shell used to form a device in accordance with embodiments of the disclosure;

FIG. 7B presents a list of process conditions for forming the outer shell by injection molding;

FIG. 7C provides a list of exemplary properties of a thermoplastic polymer for use as an outer shell in accordance with embodiments of the disclosure.

DESCRIPTION OF EMBODIMENTS

Figure 1:
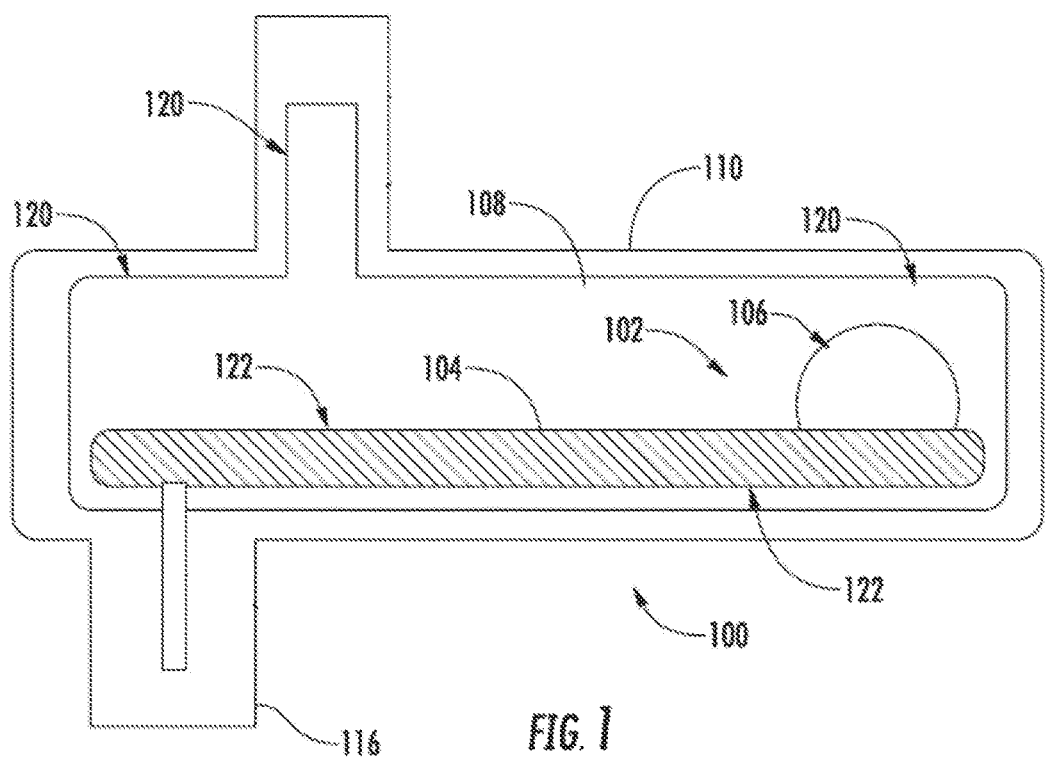
FIG. 1 depicts a device according to embodiments of the disclosure.

The present embodiments will now be described more fully hereinafter with reference to the accompanying drawings, where exemplary embodiments are shown. The embodiments are not to be construed as limited to the embodiments set forth herein. These embodiments are provided so this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate when two or more elements are in direct physical contact with one another. The terms "on,", "overlying," "disposed on," and over, may also mean two or more elements are not in direct contact with one another. For example, "over" may mean one element is above another element but not contact one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

Exemplary embodiments are directed to electrical components such as PCB components including sensors, as well as improved methods for protecting such components. For example, electrical components used in, on, or near automobile engines may be subject to harmful gas, dirt, liquids, and large changes in temperature. The present embodiments are particularly related to devices such as sensors of other electrical devices protected by a coating or shell.

Various embodiments provide novel devices protected by encapsulation using multiple layers or shells to protect an electrical component or electrical assembly. Examples of such an electrical assembly include a printed circuit board (PCB) supporting or housing at least one electrical component. In accordance with the present embodiments, the device may include an inner shell of a first polymer material and outer shell of a second polymer material, where the inner shell is disposed around the electrical assembly and in contact with the electrical assembly and the outer shell is disposed around the inner shell and in contact with the inner shell. As detailed below, the inner shell and outer shell may be tailored to generate a combination of properties such as resistance to mechanical stress, resistance to cracking, delamination, and other physical degradation, and resistance to penetration by material that is external to the device. This arrangement may provide various advantages including better protection of an electrical device such as a sensor, improved performance, and increased lifetime of the device.

In various embodiments, improved automobile sensors are provided for operation at least in the range of −50° C. to 150° C. In particular embodiments, the properties of an inner shell are tailored for compatibility with an electrical assembly to be protected, such as a PCB configured to support at least one electrical component. An outer shell may be tailored for protecting the electrical assembly from external mechanical perturbations. In addition, the inner shell and outer shell may advantageously be arranged to increase protection from external attack form gas, liquid, dirt and other environmental elements.

FIG. 1 depicts a device 100 according to embodiments of the disclosure. In some implementations, the device 100 may function as a sensor in an automobile. The embodiments are not limited in this context. The device 100 includes an electrical assembly 102 encapsulated by an inner shell 108 and outer shell 110. The electrical assembly 102 may include a PCB 104 and detector chip 106 in one example. The inner shell 108 may comprise a first polymeric material disposed around the electrical assembly 102 and in contact with the electrical assembly 102. In other words, the inner shell 108 may be a solid material having an inner surface forming an interface with the outer surface(s) of the electrical assembly 102. As detailed below, the inner shell 108 may be formed by an injection molding process where the electrical assembly 102 and a liquid precursor to the inner shell 108 are placed in a first mold and subjected to the application of pressure and temperature. This process causes the liquid precursor to coat the electrical assembly 102 during formation of the inner shell 108. Accordingly, after solidification, the inner surface 122 of the inner shell 108 may match the outer surfaces of parts of the electrical assembly 102, such as the PCB 104 and detector chip 106. In this manner, the inner shell 108 may be bonded to the electrical assembly 102.

In the device 100, the outer shell 110 may be disposed around the inner shell 108 and in contact with the inner shell 108, where an inner surface of the outer shell 110 matches the outer surface of the inner shell 108. For example, the surface 120 may serve as an inner surface of the outer shell 110 and an outer surface of the inner shell 108. Like the inner shell 108, the outer shell 110 may be a solid material. As detailed below, the outer shell 110 may also be formed by an injection molding process where the electrical assembly 102 and inner shell 108, as well as a liquid precursor to the outer shell 110, are placed in a second mold and subjected to the application of pressure and temperature.

In accordance with various embodiments of the disclosure, the inner shell 108 and outer shell 110 may differ among one another in at least one factor, including physical properties, composition, and conditions of formation. The combination of inner shell 108 and outer shell 110 may advantageously provide more robust protection to the electrical assembly 102 in comparison to known processes for protecting such electrical components. In one aspect, the physical and mechanical properties of the inner shell 108 may be tailored for compatibility with the electrical assembly 102. For example, the inner shell 108 may comprise a material suited for formation by injection molding at a relatively lower temperature and lower pressure as compared to known injection molding processes using thermoplastic materials. Examples of a suitable temperature range for injection molding to form the inner shell 108 include a temperature range between 150° C. and 200° C. Examples of suitable pressure range include a pressure range between 20 kgf/cm$^2$ and 100 kgf/cm$^2$ and in some examples between 30 kgf/cm$^2$ and 60 kgf/cm$^2$, where 1 kgf/cm$^2$=98.0665 kilopascals (kPa). By forming the inner shell 108 at a relatively lower temperature and pressure, electrical components of the electrical assembly 102 may be protected from damage otherwise likely if subject to higher temperature or higher pressure.

The outer shell 110 may comprise a material configured to provide superior mechanical and thermal protection, and may be suitable for formation using injection molding at a relatively higher temperature and pressure. Examples of a suitable temperature range for formation of outer shell 110 include a temperature between 275° C. and 315° C., and a pressure between 700 kgf/cm$^2$ and 1100 kgf/cm$^2$.

In various embodiments, the inner shell 108 may be formed from a thermoset polymer, where a "thermoset" or "thermoset polymer" as used herein refers to a material undergoing a non-reversible curing, and characterized by cross-linking between polymer chains. A thermoset material formed by injection molding of a liquid precursor may cure by the application of heat during the injection molding. Once cured, the thermoset material may retain the shape of the mold. Subsequent application of heat does not melt a thermoset material and a thermoset material tends to retain the shape formed during the curing process. Examples of suitable thermoset materials for the inner shell 108 include epoxy based materials such as an epoxy molding compound. Examples of a suitably epoxy molding compound include EME 1200D and EME E500HAC (Supplier: Chang Chun Plastics. Co., Ltd. (Hsin-Chu factory) 8, Chung Hua Rd., Fong Shan Village, Hu-Kou Industrial Park, Hsin-Chu 303, Taiwan). In various embodiments, the epoxy based material may include an epoxy resin and a silica filler, where the epoxy concentration may range from 10% to 30% and silica concentration between 60% to 90%, while phenolic resin concentration varies between 5% and 20%. The embodiments are not limited in this context.

In various embodiments, the outer shell 110 may be formed from a thermoplastic material, where a "thermoplastic material" or "thermoplastic polymer" as used herein refers to a polymer material capable of formation as a solid into a given shape, and capable of reformation into a solid of a different shape by the application of heat. Many thermoplastic materials are characterized by melting behavior and are also characterized by a low degree or zero degree of cross-linking between polymer chains. Examples of suitable thermoplastic materials for outer shell 110 include polyamide polymers, including glass reinforced polyamide polymers. Examples of suitable thermoplastic materials include. An example of a Zytel® 70G33HS1L BK031 or Zytel®70G30HSLRBK099 (Zytel is a registered trademark of Dupont corporation).

In various embodiments, the properties of the inner shell 108 may be further tailored to match those of the electrical assembly 102. In some examples, the electrical assembly 102 may have a first coefficient of thermal expansion (CTE) closely matching a second CTE of the inner shell 108. An advantage of providing an inner shell 108 where the difference in first CTE of the electrical assembly 102 and second CTE of the inner shell is small or zero, is the reduced stress evolved when the device 100 is subject to large temperature changes. For example, when implemented as a sensor device in an automobile, the device 100 may advantageously operate over a temperature range of 200° C. In one instance, the device 100 may be configured to operate over a temperature range between −50° C. and 150° C., making the device particularly suitable for operation in the environment near an automobile engine. Because the first CTE of the electrical assembly 102 and second CTE of the inner shell are closely matched, the difference in expansion or contraction of the electrical assembly 102 and inner shell 108 may be small when the temperature of the device 100 increases or decreases. This small difference in expansion reduces the thermal stress present at the interface between the electrical assembly 102 and inner shell 108. The reduced thermal stress, in turn, reduces the tendency for delamination between the inner shell 108 and electrical assembly 102, and reduced cracking and other defects in the inner shell 108, and reducing damage generated by stress to the electrical assembly 102. Because the device 100 may be subjected to repeated cycling between different temperatures, this reduced thermal stress may accordingly increase the reliability or lifetime of the device 100 compared to known sensor devices.

The outer shell 110 may have a third CTE less well matched to the first CTE of the electrical assembly 102. Because the outer shell 110 does not directly contact the electrical assembly 102 the difference in CTE between the first CTE and third CTE may not generate deleterious stress near the electrical assembly 102.

Figure 2A:
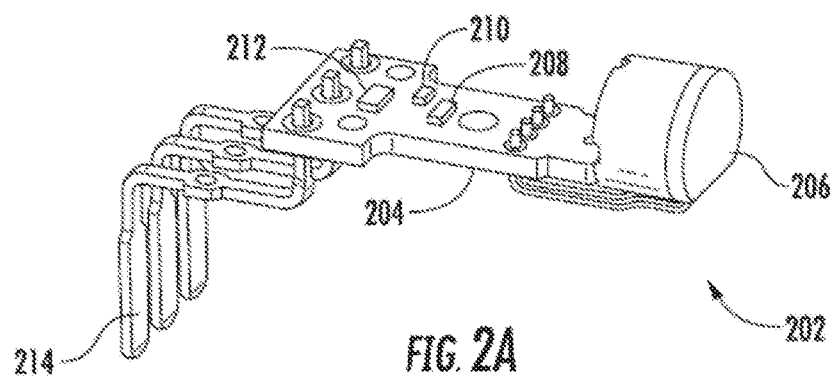
FIG. 2A, FIG. 2B, and FIG. 2C depict different stages in the formation of a device in accordance with embodiments of the disclosure.
Figure 2B:
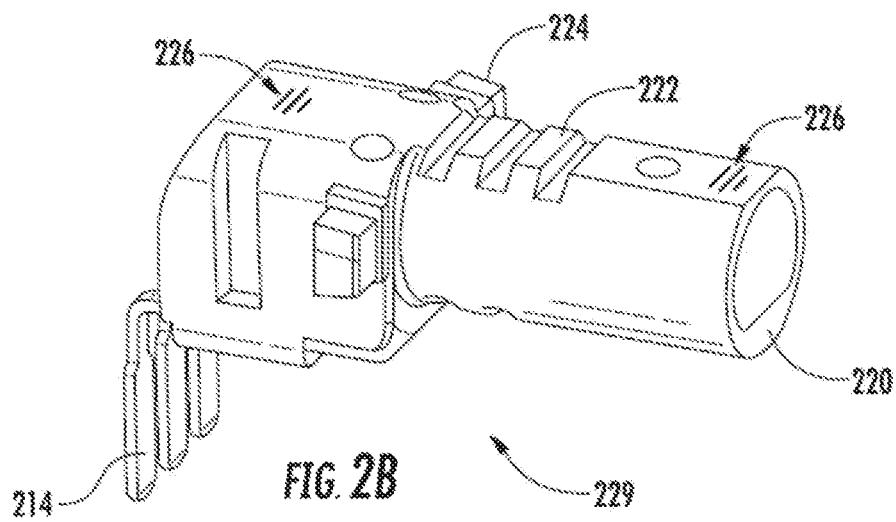
Figure 2C:
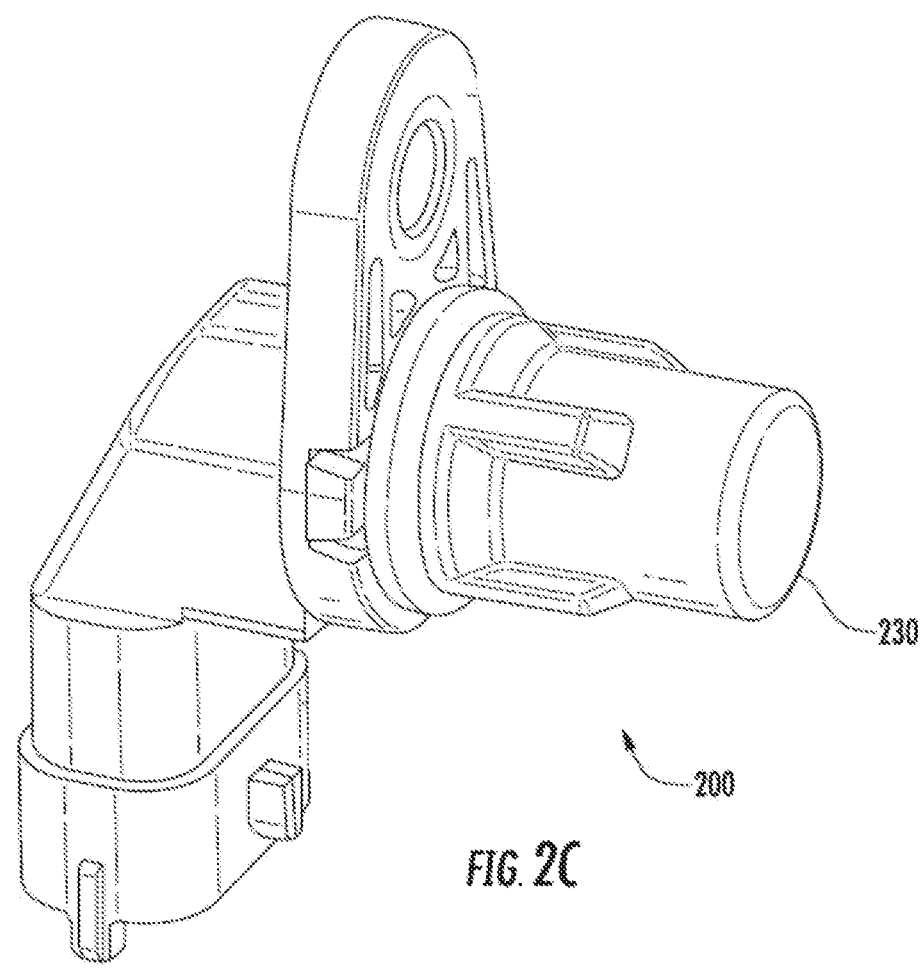
Figure 3A:
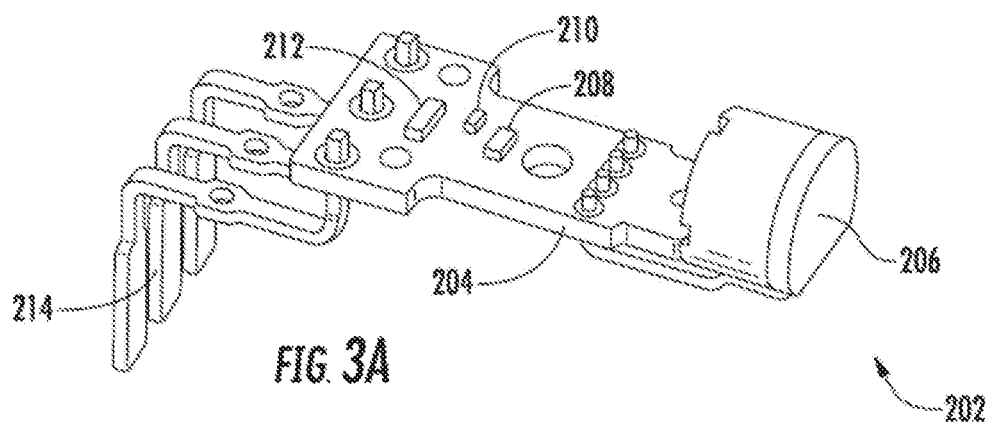
FIG. 3A, FIG. 3B, and FIG. 3C depict a transparent view of the stages of formation of the device corresponding to the FIGS. 2A, 2B, and 2C, respectively.
Figure 3B:
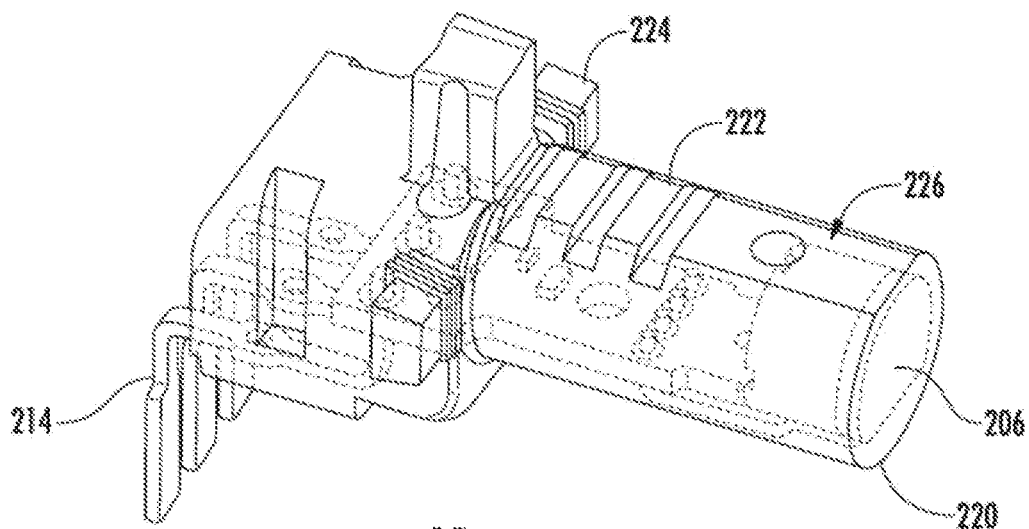
Figure 3C:
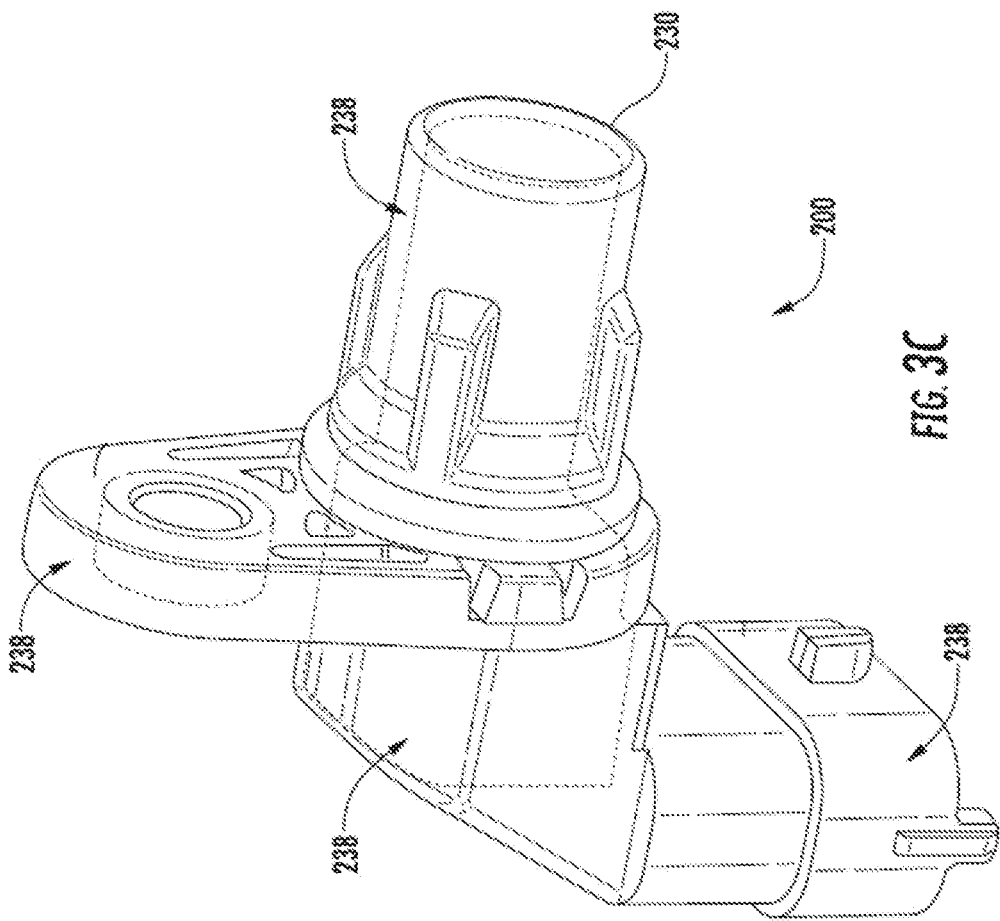

FIG. 2A, FIG. 2B, and FIG. 2C depict different stages in the formation of a device 200 in accordance with embodiments of the disclosure. In some implementations, the device 200 functions as a sensor in an automobile. The device 200 and its precursors are illustrated in perspective view to aid understanding. To further aid understanding FIG. 3A, FIG. 3B, and FIG. 3C depict a transparent view of the stages of formation of device 200 corresponding to the FIGS. 2A, 2B, and 2C, respectively. In FIG. 2A and FIG. 3A, there is shown an electrical assembly 202. The electrical assembly 202 includes a PCB 204. A detector chip 206, capacitor 208, capacitor 210 and resistor 212 are attached to the PCB 204. In addition, a lead assembly 214 is attached to the PCB 204 and extends outwardly (downwardly) to provide electrical connections to external devices.

For protection, the electrical assembly 202 is subjected to two molding operations as suggested in FIGS. 2B, 3B and FIGS. 3B, 3C, respectively. In FIGS. 2B, 3B there is shown an inner shell 220 disposed around the electrical assembly 202, protecting the PCB 204 and electrical components including detector chip 206, capacitor 208, capacitor 210, and resistor 212. The inner shell 220 may be formed by an injection molding process. For example, the electrical assembly 202 may be placed in a first injection mold (not shown) having a shape corresponding to the outer surface 226 of the inner shell 220. An injection mold machine (not shown) may be configured to inject a liquid precursor (not shown) of the inner shell 220 into the first injection mold. The liquid precursor of the inner shell 220 may then come into contact with the electrical assembly 202 and may coat the electrical assembly 202. When temperature and pressure are applied, the liquid precursor may then solidify, resulting in the inner shell 220 having an outer surface 226 as shown. Although not visible in FIG. 2B, an inner surface of the inner shell 220 may be in contact with the electrical assembly 202 and may thus be bonded to the electrical assembly 202.

In accordance with various embodiments of the disclosure, the inner shell 220 may be made from a polymeric material having a coefficient of thermal expansion (CTE) matching the CTE of the PCB 204. For example, a commercial grade glass epoxy printed circuit board designated FR4 may have an average in-plane CTE of $1.3 \times 10^{-5}$/K. In various embodiments, the inner shell 220 may have a CTE in the range of $1 \times 10^{-5}$ to $1.5 \times 10^{-5}$, and in particular embodiments, the CTE of inner shell 220 may be $1.3 \times 10^{-5}$. Notably, the exact polymer material and formulation, as well as concentration of a filler material, for inner shell 220 may be chosen to provide a close match of CTE of inner shell 220 and material of PCB 204. For example, many thermoset polymers may have a CTE that does not closely match that of a PCB 204, and may have a CTE that is either too high or possibly too low to provide a good match to the CTE of PCB 204. In the present embodiments, suitable materials for use as inner shell 220 include thermoset materials such as EME 1200D or EME E500HAC, or other composites including thermoset polymers and a filler such as silica. Advantageously, this match between CTE of inner shell 220 and PCB 204 may avoid or minimize thermal stresses arising when the device 200 is operated over a range of temperatures. Accordingly, device 200 may provide improved performance as a sensor device in an automobile, for example.

As further shown in FIGS. 2B, 3B, the inner shell 220 may include various structures formed having the shape of the mold used to form the inner shell. In particular, a mold to form the inner shell 220 may be designed to generate structures on the outside of the inner shell 220 to improve the performance, longevity, or reliability of the electrical assembly 202. For example, the inner shell 220 may include the structures 222, and structure 224, where the structures protrude outwardly. Such structures or other structures may be used to increase the mechanical coupling between the inner shell 220 and outer shell 230, to increase sealing between the inner shell 220 and outer shell 230, or for other reasons.

Turning now to FIG. 2C and FIG. 3C, there is shown the completed device, device 200, after formation of the outer shell 230. The outer shell 230 may also be formed by an injection molding process. For example, the electrical assembly 202 and inner shell 220 may be considered to constitute a singly encapsulated device 229. The singly encapsulated device 229 may subsequently be placed in a second injection mold (not shown) having a shape corresponding to the outer surface 238 of the outer shell 230. An injection mold machine (not shown) may be configured to inject a liquid precursor (not shown) of the outer shell 230 into the second injection mold. The liquid precursor of the outer shell 230 may then come into contact with the inner shell 220 and may coat the inner shell 220. When temperature and pressure are applied the liquid precursor may then solidify, resulting in formation of the outer shell 230 having the outer surface 238 as shown. Notably, the outer surface 238 of the outer shell 230 may have an outer shape that is different than an outer shape of the outer surface 226 of the inner shell 220, as can be seen by a comparison of FIG. 2B and FIG. 2C. Additionally, the inner surface of the outer shell 230 may be in contact with the outer surface 226 of the inner shell 220 and may thus be bonded to the inner shell 220.

In accordance with various embodiments of the disclosure, the outer shell 230 may be made from a polymeric material whose mechanical strength is greater than mechanical strength of the inner shell 220. As used herein, the term "mechanical strength" may refer to properties of a material including flexural strength and impact strength. This greater mechanical strength may result in better protection of the device 200 from impacts, stresses, and other perturbations. In some examples, the outer shell 230 may have a flexural strength of 250 MPa to 300 MPa, and a notched Charpy notched impact strength of 10-15 kJ/m² at 23° C. The embodiments are not limited in this context. The inner shell 220 may have a relatively lesser mechanical strength, such as a flexural strength of 140 MPa to 170 Mpa.

Notably, in various embodiments, a suitable material for outer shell 230 may include thermoplastic polymers. In some examples where the outer shell 230 is formed from a thermoplastic polymer, the CTE of outer shell 230 may range from $5 \times 10^{-5}$/K to $1.2 \times 10^{-4}$/K. This creates a difference in CTE of the outer shell 230 and electrical assembly 202 of approximately $4 \times 10^{-5}$/K to $11 \times 10^{-5}$/K. Advantageously, since the outer shell 230 is not directly bonded to the electrical assembly 202 this difference in CTE may not adversely affect performance of the device 200.

The two shells of device 200 may accordingly provide a combination of properties to increase the performance, lifetime, or reliability of the device 200 with respect to known sensors. For example, in known sensors, an electrical assembly may be encapsulated in just one coating or shell, such as a thermoplastic material or other material where the CTE of the shell does not match the CTE of an electrical assembly. Because of differences in CTE between a thermoplastic material and a PCB, thermal stresses may generate cracking, delamination, or degradation of electrical components of such a device, as noted above. In the present embodiments, the electrical assembly is encapsulated by an inner shell whose CTE may closely or exactly match the CTE of a PCB of an electrical assembly. This close match in CTE eliminates or reduces the above mentioned problems. Additionally, the outer shell provides the benefit of better mechanical strength, forming a more robust protection for the doubly encapsulated devices of the present embodiments.

Figure 4A:
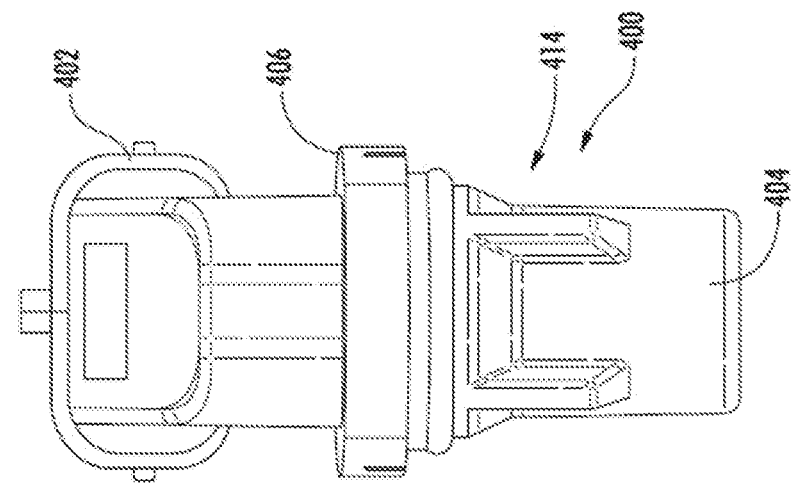
FIG. 4A, FIG. 4B, FIG. 4C, and FIG. 4D depict different views of a device according to further embodiments of the disclosure.

As noted above, in various embodiments of the disclosure, an inner shell and outer shell of a doubly encapsulated device may be mutually configured to provide enhanced mechanical coupling between the inner shell and outer shell as well as enhanced sealing. FIG. 4A, FIG. 4B, FIG. 4C, and FIG. 4D depict different views of a device 400 according to further embodiments of the disclosure. The device 400 may be configured similarly to device 200 in some instances. In FIG. 4A there is shown a top transparent view illustrating an inner shell 404 and outer shell 402. An electrical assembly encapsulated by the inner shell is not shown. However, the electrical assembly may be similar to the electrical assembly 202 depicted in FIG. 3A, for example.

Figure 4B:
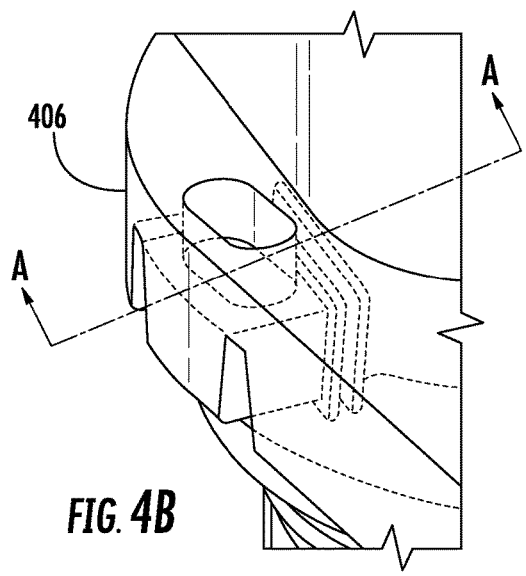
Figure 4C:
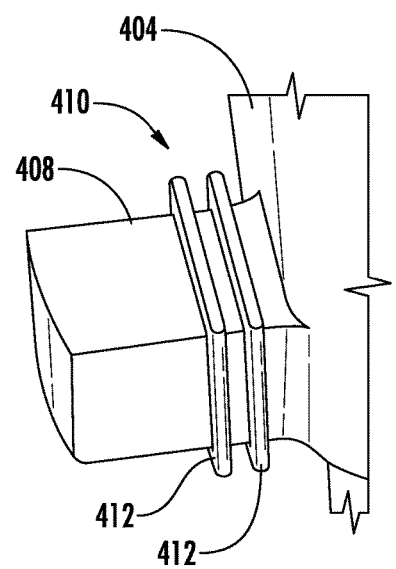
Figure 4D:
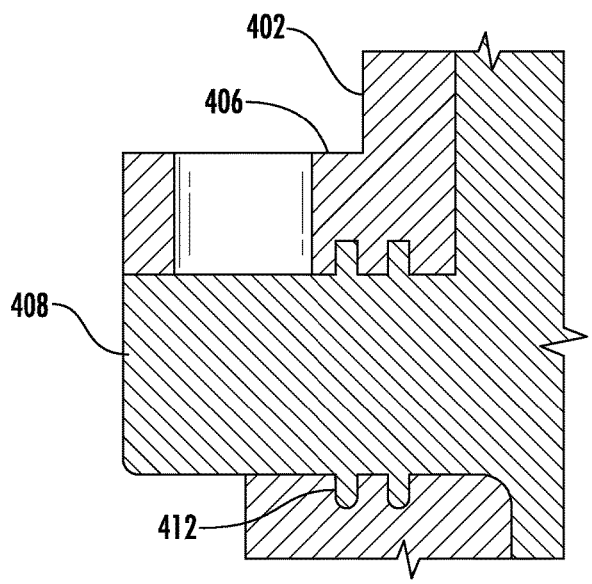

As shown in FIG. 4A and FIG. 4B, the outer shell 402 includes a feature 406 extending outwardly from a cylindrical portion 412 of the outer shell 402. Turning now to FIG. 4C, there is shown a perspective view of a post portion 408 of the inner shell 404. The inner shell 404 may include more than one post portion 408, where the post portion may couple to the outer shell 402 and be used to orient the inner shell 404 with respect to outer shell 402. The post portion 408 may include a sealing assembly 410, including sealing rib assembly shown as the sealing ribs 414. FIG. 4D presents a sectional view along the direction A-A shown in FIG. 4B. As illustrated, the sealing ribs 414 of post portion 408 facilitate interlocking of the post portion 408 to the outer shell 402. This may particularly increase sealing of the device 400 to keep dirt, gas, liquid, moisture, and other material from attack on an electrical assembly disposed within the device 400.

FIG. 5 depicts an exemplary process flow 500 in accordance with further embodiments. At block 502, an electrical assembly is provided having at least one electrical component. In some examples, the electrical assembly may comprise a PCB having at least one electrical component disposed thereon. The electrical assembly may have a first coefficient of thermal expansion (CTE).

At block 504 an inner shell comprising a first polymeric material is formed around the electrical assembly, where the inner shell is in contact with the electrical assembly. In some embodiments, the inner shell may comprise a second coefficient of thermal expansion closely matching the first coefficient of thermal expansion. For example, the difference between the second coefficient of thermal expansion and first coefficient of thermal expansion may be less than $1 \times 10^{-5}$/K in some instances, and in particular cases may be less than $2 \times 10^{-6}$/K. In some embodiments, the inner shell may be formed by injection molding where the electrical assembly is placed in a first mold and subject to injection of a liquid precursor of the inner shell at a first temperature and a first pressure. In some examples, the first temperature may range between 150° C. and 200° C. and the first pressure may range from 20 kg/cm² to 100 kg/cm².

At block 506 an outer shell comprising a second polymeric material is formed around the electrical assembly, where the inner shell is in contact with the electrical assembly. In some embodiments, the outer shell may be formed by injection molding where a singly encapsulated device made of the inner shell and electrical assembly is placed in a second mold. In some embodiments, the outer shell may comprise a third coefficient of thermal expansion not closely matching the first coefficient of thermal expansion. For example, the difference between the third coefficient of thermal expansion and first coefficient of thermal expansion may be greater than $5 \times 10^{-5}$/K in some instances. The singly encapsulated device may be subject to injection of a liquid precursor of the outer shell at a second temperature and a second pressure, where at least one of the second temperature and second pressure is greater than the first temperature and first pressure. In some embodiments, the second temperature may range between 275° C. and 315° C. and the second pressure may range between 700 kg/cm$^2$ and 1100 kg/cm$^2$. In some examples the mold temperature in a second injection molding process may be different than that of the temperature of the liquid. In some examples, the temperature of the liquid as injected in the mold may range between 275° C. and 315° C., and in particular between 285° C. and 315° C., while in some examples the mold temperature may range from 285° C. to 305° C.

Advantageously the exemplary method of FIG. 5 provides an additional advantage by virtue of the process for formation the inner shell encapsulating an electrical assembly. As noted above, the first formation processes for forming the inner shell may be an injection molding process to form a thermoset polymer at a temperature range between 150° C. and 200° C. This lower temperature range is much lower than a second temperature range used to form the outer shell. The lower temperature range for formation of the inner shell may be adequately low to avoid damage to the electrical assembly being encased. Likewise, the use of a lower pressure range of 20 kg/cm$^2$ to 100 kg/cm$^2$ to form the inner shell may protect the electrical assembly against damage by avoiding the exposure of the electrical assembly to higher pressure used to form the outer shell. Subsequently, when higher temperature and higher pressure are used in the injection molding process to form the outer shell, the inner shell may serve as a shield to prevent damage of the electrical assembly. In addition, because the CTE of the inner shell may be the same as that of the electrical assembly, thermal stress is avoided or minimized at the interface between the inner shell and electrical assembly during the higher temperature injection molding process for forming the outer shell.

FIG. 6 presents an exemplary list 600 of properties for an inner shell used to form a device in accordance with embodiments of the disclosure. In the example of FIG. 6, the material of the inner shell is a thermoset polymer. FIG. 6 also presents a list 602 of process conditions for forming the inner shell by injection molding. The composition of the material of FIG. 6 may range between approximately 5% to 20% phenolic resin, 60% to 90% silica filler, and 10% to 30% epoxy.

As shown, the temperature for formation of the inner shell does not exceed 195° C. and the pressure does not exceed 100 kg/mm$^2$.

FIG. 7A provides a list 700 of properties for an outer shell used to form a device in accordance with embodiments of the disclosure. In the example of FIG. 7A, the material of the outer shell is a thermoplastic polymer. As evident, the CTE (CLTE) is higher than a common value of $1.3\times10^{-5}$ for a PCB. FIG. 7B presents a list 702 of process conditions for forming the outer shell by injection molding. As shown, the melt temperature for formation of the outer shell is approximately 295° C. and the pressure does not exceed 100 kg/mm$^2$.

FIG. 7C provides a list 710 of exemplary properties of a thermoplastic polymer for use as an outer shell in accordance with embodiments of the disclosure. As evident, the modulus and impact strength provide excellent mechanical properties useful to protect a device from external stresses.

While the present embodiments have been disclosed with reference to certain embodiments, numerous modifications, alterations and changes to the described embodiments are possible without departing from the sphere and scope of the present disclosure, as defined in the appended claims. Accordingly, it is intended the present embodiments not be limited to the described embodiments, and instead has the full scope defined by the language of the following claims, and equivalents thereof.

What is claimed is:

1. A device, comprising:
    an electrical assembly having at least one electrical component;
    an inner shell comprising a first polymeric material disposed around the electrical assembly and in contact with the electrical assembly, the inner shell comprising a first mechanical strength; and
    an outer shell comprising a second polymeric material conformally disposed around the inner shell and in contact with the inner shell, the outer shell comprising a second mechanical strength greater than the first mechanical strength,
    wherein the electrical component comprises a first coefficient of thermal expansion (CTE), the inner shell comprises a second CTE, and the outer shell comprises a third CTE, and wherein a difference between the first CTE and second CTE is less than $0.5\times10^{-5}$/K, and the third CTE exceeds the first CTE by $4\times10^{-5}$/K to $11\times10^{-5}$/K.

2. The device of claim 1 wherein the electrical assembly has a first outer surface defining a first outer shape, the inner shell comprises a second outer surface defining a second outer shape different than the first outer shape; and wherein the outer shell comprises a third outer surface defining a third outer shape different than the first outer shape.

3. The device of claim 1, wherein the inner shell comprises a thermoset material and the outer shell comprises a thermoplastic material.

4. The device of claim 1, wherein the electrical assembly comprises a printed circuit board (PCB) and at least one electrical component disposed thereon.

5. The device of claim 1, wherein the inner shell and outer shell are configured to operate over a temperature range of −50° C. to 150° C.

6. The device of claim 2, wherein the second outer surface of the inner shell comprises a sealing rib assembly configured to increase sealing between the inner shell and outer shell by mechanically coupling to the outer shell.

7. The device of claim 2, wherein the third outer shape is different than the second outer shape.

8. The device of claim 1, wherein the inner shell comprises a post portion configured to couple to the outer shell.

9. A method of forming an electrical device, comprising:
    providing an electrical assembly having at least one electrical component;
    forming an inner shell comprising a first polymeric material around the electrical assembly, the inner shell being in contact with the electrical assembly; and
    forming an outer shell comprising a second polymeric material around the inner shell and in contact with the inner shell,
    wherein the electrical assembly comprises a first coefficient of thermal expansion (CTE), the inner shell comprises a second CTE, and the outer shell comprises a third CTE, and wherein a difference between the second CTE and first CTE is less than a difference between the third CTE and first CTE, wherein the forming the inner shell comprises:
    providing the electrical assembly in a first mold;
    dispensing a first liquid precursor of the inner shell into the first mold; and
performing a first injection molding process on the first liquid precursor and electrical component at a first temperature and a first pressure, wherein a singly encapsulated device is formed comprising the inner shell and electrical assembly, and wherein the forming the outer shell comprises:
provide the singly encapsulated device in a second mold;
dispensing a second liquid precursor of the second polymeric material into the second mold; and
performing a second injection molding process on the singly encapsulated device at a second temperature and a second pressure greater than the first pressure.

10. The method of claim 9, wherein the second temperature is higher than the first temperature.

11. The method of claim 9, wherein the inner shell comprises a thermoset material, and wherein the outer shell comprises a thermoplastic material.

12. The method of claim 9, wherein the first temperature is between 150° C. and 200° C. and the first pressure is between 20 kgf/cm² and 100 kgf/cm².

13. The method of claim 9, wherein the second temperature is between 275 and 315° C. and the second pressure is between 700 kgf/cm² and 1100 kgf/cm².

14. A sensor device, comprising:
a printed circuit board;
at least one sensor attached to the printed circuit board;
an inner shell comprising a first polymeric material disposed around the printed circuit board and at least one electrical device, and in contact with the printed circuit board and at least one electrical device; and
an outer shell comprising a second polymeric material disposed around the inner shell and in contact with the inner shell, the inner shell comprising a first mechanical strength; and the outer shell comprising a second mechanical strength greater than the first mechanical strength,
wherein the printed circuit board comprises a first coefficient of thermal expansion (CTE), the inner shell comprises a second CTE, and the outer shell comprises a third CTE, and wherein a difference between the first CTE and second CTE is less than $0.5\times10^{-5}$/K, and the third CTE exceeds the first CTE by $4\times10^{-5}$/K to $11\times10^{-5}$/K.

15. The sensor device of claim 14, wherein the inner shell comprises a thermoset material and the outer shell comprises a thermoplastic material.

16. The sensor device of claim 14, wherein the inner shell and outer shell are configured to operate over a temperature range of −50° C. to 150° C.

17. The sensor device of claim 14, wherein the inner shell comprises:
a sealing rib assembly configured to increase sealing between the inner shell and outer shell by mechanically coupling to the outer shell; and
a post portion configured to couple to the outer shell.

* * * * *